United States Patent [19]
Jones

[11] Patent Number: 5,920,080
[45] Date of Patent: Jul. 6, 1999

[54] EMISSIVE DISPLAY USING ORGANIC LIGHT EMITTING DIODES

[75] Inventor: Gary W. Jones, Lagrangeville, N.Y.

[73] Assignee: Fed Corporation, Hopewell Junction, N.Y.

[21] Appl. No.: 09/074,424

[22] Filed: May 8, 1998

Related U.S. Application Data

[60] Provisional application No. 60/050,459, Jun. 23, 1997.
[51] Int. Cl.⁶ .............................. H01L 35/24; H01L 33/00
[52] U.S. Cl. .............................. 257/40; 257/98; 257/103; 313/509
[58] Field of Search .................................. 257/40, 98, 99, 257/103; 313/509, 500, 503, 506

[56] References Cited

U.S. PATENT DOCUMENTS

| | | |
|---|---|---|
| 5,189,405 | 2/1993 | Yamashita et al. ..................... 313/509 |
| 5,482,896 | 1/1996 | Tang . |
| 5,530,269 | 6/1996 | Tang .......................................... 257/88 |
| 5,619,045 | 4/1997 | Konuma et al. .......................... 257/72 |
| 5,641,974 | 6/1997 | den Boer et al. ......................... 257/59 |

*Primary Examiner*—Minh Loan Tran
*Attorney, Agent, or Firm*—Collier, Shannon, Rill & Scott, PLLC

[57] ABSTRACT

An organic light emitting device ("OLED") for a color video display. The OLED is a layered structure formed on a substrate. A layer of light emitting organic material is sandwiched between two conductive layers and placed on the substrate. Overlying the conductors and organic layer is a transparent cover layer. The OLED of the present invention includes an innovative microcavity enhancing structure, which restricts light emission in directions parallel to the substrate and provides increased light output toward the viewer.

24 Claims, 6 Drawing Sheets

EMISSIVE DISPLAY USING ORGANIC LIGHT EMITTING DIODES

CROSS REFERENCE TO RELATED PATENT APPLICATION

This application relates to and claims priority to U.S. Provisional Application Ser. No. 60/050,459, entitled "EMISSIVE DISPLAY USING ORGANIC LIGHT EMITTING DIODES" filed on Jun. 23, 1997.

FIELD OF THE INVENTION

The present invention relates to an Organic Light Emitting Device ("OLED") video display structure for a color video display or high brightness monochrome display. More specifically, the present invention relates to an OLED with a microcavity structure for enhancing light emission.

BACKGROUND OF THE INVENTION

Organic light emitting devices have been known for approximately two decades. OLEDs work on certain general principles. An OLED is typically a laminate formed on a substrate such as soda-lime glass or silicon. A light-emitting layer of a luminescent organic solid, as well as adjacent semiconductor layers, are sandwiched between a cathode and an anode. The semiconductor layers may be hole-injecting or electron-injecting layers. The light-emitting layer may be selected from any of a multitude of fluorescent organic solids. The light-emitting layer may consist of multiple sublayers or a single blended layer.

When a potential difference is applied across the device, negatively charged electrons move from the cathode to the electron-injecting layer and finally into the layer(s) of organic material. At the same time positive charges, typically referred to as holes, move from the anode to the hole-injecting layer and finally into the same organic light-emitting layer(s). When the positive and negative charges meet in the layer(s) of organic material, they combine, and produce photons.

The wave length—and consequently the color—of the photons depends on the material properties of the organic material in which the photons are generated. The color of light emitted from the OLED can be controlled by the selection of the organic material, or by the selection of dopants, or by other techniques known in the art. Different colored light may be generated by mixing the emitted light from different OLEDs. For example, white light is produced by mixing blue, red, and green light simultaneously.

In a typical OLED, either the anode or the cathode is transparent in order to allow the emitted light to pass through to the viewer. The cathode is typically constructed of a low work function material. The holes are typically injected from the anode, a high work function material, into the organic material via a hole transport layer.

Typically, OLEDs operate with a DC bias of 2 to 30 volts. The OLED brightness may be controlled by adjusting the voltage or current supplied to the anode and cathode. The relative amount of light generated is commonly referred to as the "gray level." OLEDs typically work best when operated in a current mode. The light output is more stable for constant current drive than for a constant voltage drive. This is in contrast to many other display technologies, which are normally operated in a voltage mode. As a result, an active matrix display using OLED technology, requires a specific pixel architecture to provide for a current mode of operation.

In a typical matrix-addressed OLED device, numerous OLEDs are formed on a single substrate and arranged in groups in a regular grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time. A group of OLEDs within the matrix may form one pixel in a display, with each OLED usually serving as one subpixel or pixel cell.

OLEDs have a number of beneficial characteristics. These include: a low activation voltage (about 5 volts); fast response when formed with a thin light-emitting layer; high brightness in proportion to the injected electric current; high visibility due to self-emission; superior impact resistance; and ease of handling of the solid state devices in which they are used. OLEDs, have practical application in television, graphic display systems, and digital printing.

Although substantial progress has been made in the development of OLEDs to date, additional challenges remain. For example, OLEDs continue to face a general series of problems associated with their long-term stability. In particular, during operation the layers of organic film may undergo recrystalization or other structural changes that adversely affect the emissive properties of the device.

Exposure to air and moisture presents unique problems with respect to OLEDs. Exposing a conventional OLED to the atmosphere shortens its life. The organic material in the light-emitting layer(s) reacts with water vapor, oxygen, etc. Lifetimes of 5,000 to 35,000 hours have been obtained for evaporated films and greater than 5,000 hours for polymers. However, these values are typically reported for room temperature operation in the absence of water vapor and oxygen. Lifetimes associated with operations outside these conditions are typically much shorter.

The low work function cathode is susceptible to oxidation by either water vapor or oxygen. Electroluminescence from oxidized areas is typically lower than other areas. The anode may also be affected by oxidation. The penetration of oxygen and moisture into the interior of the OLED may result in the formation of metal oxide impurities at the metal-organic material interface. These metal oxide impurities may cause separation of the cathode or anode from the organic material. Dark, non-emitting spots may appear at the areas of separation due to a lack of current flow. Cathode materials such as Mg-Ag or Al-Li are especially susceptible to oxidation.

To obtain a practical, useable OLED, it is necessary to protect the device, so that water, oxygen, etc., do not infiltrate the light-emitting layer or oxidize the electrodes. Methods commonly employed for protecting or sealing inorganic electroluminescent devices are typically not effective for sealing OLEDs. For example, in the "silicon oil method" of sealing inorganic electroluminescent devices, the silicon oil can infiltrate the light-emitting layer of an OLED, the electrodes, and any hole-injecting or electron-injecting layers. This may alter the organic light-emitting layer, reducing or eliminating its light emission properties. Likewise, resin coatings that have been used to protect inorganic EL devices are not suited for OLEDs. The solvent used in the resin coating solution tends to infiltrate the light-emitting layer of the OLED, degrading the light emission properties of the device.

Protective films may be used to seal OLEDs. For example, an electrically insulating polymer may be deposited on an outer surface of the OLED. Evaporated metal films are also used to seal OLEDs in a similar manner. Evaporated metal and polymer films are both susceptible to pinholes. To avoid pinholes these films must be relatively thick and hence result in poor light transmission. Accordingly, there remains a need for a method of sealing an OLED which does not degrade light emissions from the device.

Edge shorting between the cathode and anode layers is another problem affecting most conventional OLED devices. Edge shorting reduces the illumination potential of the display. Edge shorting is the channeling of light within the organic layers. As a result of the channeling, light is not directed toward the viewer. Also, when light is emitted at all forward angles, i.e., in a Lambertian manner, it may activate neighboring OLEDs reducing contrast or color purity. Thus, there is a need to develop a microcavity structure capable of limiting edge shorting and increasing illumination.

A passive OLED matrix pulses light at high pixel brightness in order to achieve moderate overall brightness. An active OLED matrix with sustained application of voltage across the anode and cathode may produce the same brightness with a much lower pixel luminance. However, in order to achieve the same appearance as the passive matrix, the active matrix must be refreshed continuously. As a result, there is a need to provide a method of refreshing an OLED display during the time that the organic layers are exposed to the electrical potential between, the anode and the cathode.

A typical matrix of OLEDs experiences certain problems. As described above, the OLEDs located within the matrix may experience channelling. The channeling of light in one OLED or subpixel may cause the inadvertent activation of neighboring subpixels. Furthermore, the proximity of the subpixels within the matrix can cause a reduction in ambient light contrast across the matrix. The need exists for a matrix design with improved color purity and ambient light contrast.

The present invention meets the needs set forth above, and provides other benefits as well.

OBJECTS OF THE INVENTION

Therefore it is an object of the present invention to provide an active matrix design that maximizes the peak luminance of an organic light emitting device.

It is another object of the present invention to reduce edge shorting in an organic light emitting device.

A further object of the present invention is to provide an organic light emitting device with improved luminance.

It is another object of the present invention to provide an organic light emitting device with improved light directionality.

A further object of the present invention is to provide a method and structure for sealing organic light emitting devices which provides a substantially moisture free OLED without degrading light emissions.

It is a further object of the present invention to provide an organic light emitting device with relatively no reduction in illumination during periods of sustained activity.

Another object of the present invention is to provide a matrix of organic light emitting devices with improved color purity.

It is a further object of the present invention to provide a matrix of organic light emitting devices with high ambient light contrast.

Additional objects and advantages of the invention are set forth, in part, in the description which follows and, in part, will be apparent to one of ordinary skill in the art from the description and/or from the practice of the invention.

SUMMARY OF THE INVENTION

In response to this challenge, Applicant has developed an innovative, economical organic light emitting device comprising: a substrate; a first conductor overlying the substrate; a layer of light emitting organic material overlying the first conductor; a second conductor overlying the layer of light emitting material; and a means for restricting light emission in directions parallel to the substrate. The device's substrate is substantially planar and may comprise a silicon wafer. The device may further comprise a means for connecting the silicon wafer to the first conductor. The means for restricting light emission may overlie the layer of light-emitting organic material. The means for restricting light emission may comprise either a layer of dielectric material or a plurality of layers of dielectric material. The means for restricting light emission may also comprise either a layer of transparent conductor material or multiple layers of transparent conductor material which overlie the first conductor and underlie the light emitting organic material. The first conductor may be planarized. Each of the plurality of layers of dielectric material may have a different index of refraction from that of any adjacent layer. The layers of dielectric may be deposited or evaporated at an angle to the substrate surface. Alternatively, the dielectric layers may be constructed while the substrate is rotating. The device may further comprise a transition layer underlying the first conductor and a barrier layer overlying the second conductor.

The barrier layer comprises a diamond-like carbon material and may function as an electron injector. The device of the present invention may further comprise a getter layer overlying the second conductor and underlying the barrier layer, and a sealing layer overlying the barrier layer. The sealing layer may comprise a heat adhesive seal. The device may further comprise a getter layer overlying the layer of light emitting organic material and underlying the second conductor. The device may further comprise a top cover overlying the barrier layer.

The present invention includes an innovative organic light emitting display comprising: a planar substrate having a perimeter and comprising a plurality of organic light emitting devices, wherein each of the plurality of organic light emitting devices is capable of being placed in various current or voltage states by a plurality of drivers; the plurality of organic light emitting devices comprise first and second conductors capable of receiving signals from the plurality of drivers, and wherein a plurality of interstices exist between the plurality of organic light emitting devices; a black matrix overlying the substrate and located in the interstices between and around each of the plurality of organic light emitting devices; and a top cover overlying the plurality of organic light emitting devices. The plurality of drivers may be an integral part of the planar substrate or connected to the perimeter of the planar substrate. The light emitting devices of the display may include a conductive plug connecting the first conductor to the planar substrate. The conductive plug may be planarized. The organic light emitting devices of the display may each include a means for restricting the emission of light in a direction parallel to the planar substrate. The means for restricting the emission of light may comprise a plurality of layers of dielectric material.

The present invention includes an innovative method of fabricating an organic light emitting device comprising the steps of: providing a planar substrate; constructing a first conductor over the planar substrate; constructing a layer of light emitting organic material overlying the first conductor; constructing a second conductor overlying the layer of light emitting material; and constructing a plurality of layers of dielectric material over the second conductor for restricting light emission in directions parallel to the planar substrate. The step of constructing a first conductor may include planarizing the first conductor. The step of constructing a first conductor may include tapering the edges of the first conductor. The step of planarizing the first conductor may comprise: forming the first conductor; depositing a layer of dielectric material over the first conductor; and chemical mechanically polishing the surface of the dielectric material creating a planarized planar surface comprising both conductor and dielectric materials. The method of fabricating the organic light emitting device may further include the step of ion bombarding the dielectric materials during the steps of constructing a plurality of layers of dielectric material. The innovative method may further include the step of constructing a layer of getter material overlying the second conductor. The step of constructing the plurality of layers of dielectric material may include evaporating or depositing the materials at an angle to the substrate surface. The method may further comprise the step of constructing a barrier layer over the second conductor. The barrier layer may comprise diamond-like carbon material.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

DETAILED DESCRIPTION OF THE INVENTION

Figure 1:
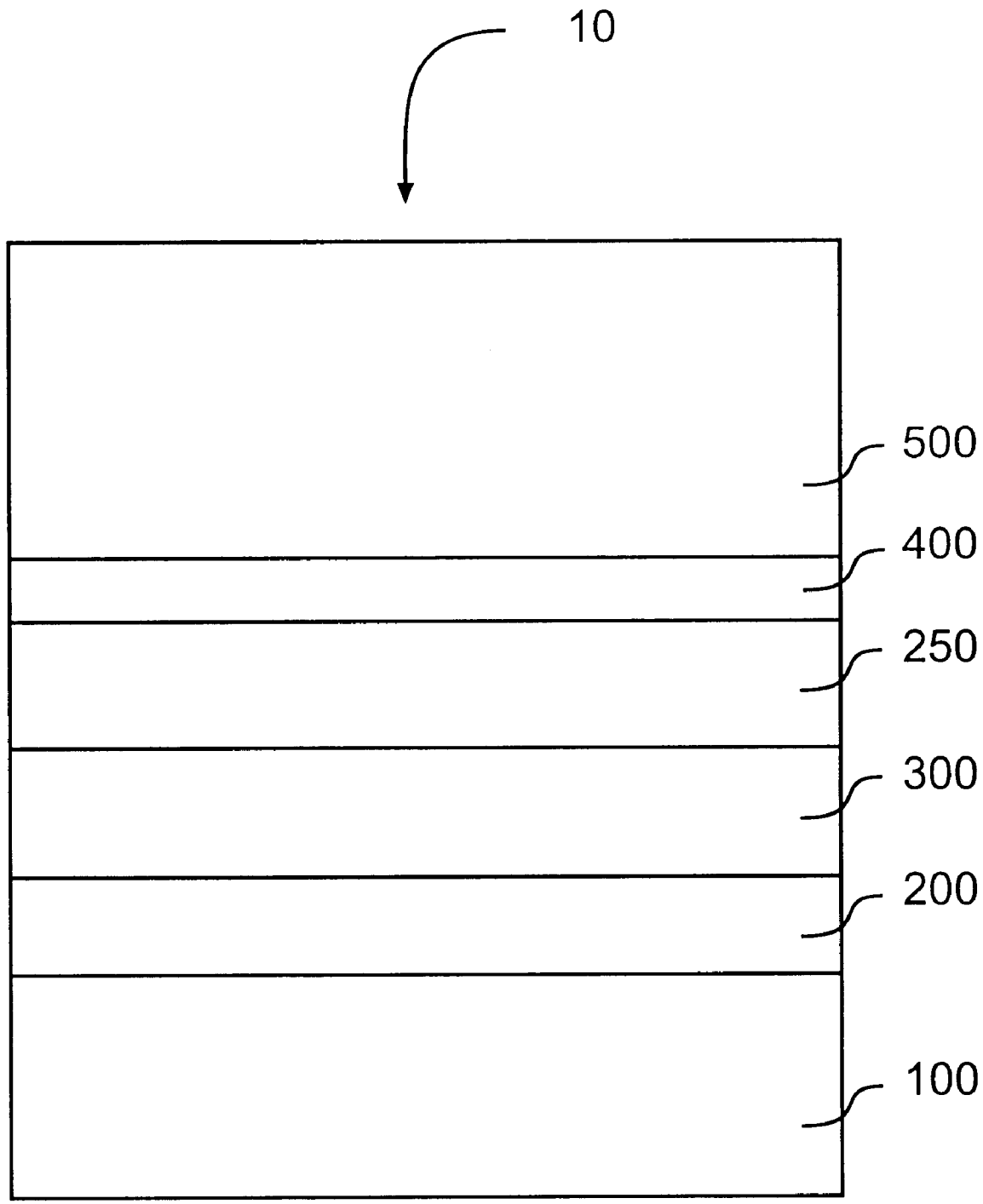
FIG. 1 is a side perspective view of an organic light emitting display device according to the present invention.

FIG. 1 discloses an organic light emitting device ("OLED") constructed according to the present invention. As embodied herein, OLED 10 of the present invention is shown in FIG. 1 and includes a substrate 100. Overlying the substrate 100 is a first conductor 200. Overlying the first conductor 200 is a second conductor 250. Sandwiched between the conductor layers is a layer of light emitting organic material 300. Overlying the conductors and the organic material is a top cover 500. Between the second conductor 250 and the top cover 500 is a microcavity stack 400.

The substrate 100 is substantially planar and underlies and provides support for the entire OLED structure. The first and second conductors 200 and 250 function as either electron injecting or hole injecting layers. When the positive and negative charges from the conductors meet in the layer of organic material 300, light is emitted. OLED 10 of the present invention may emit light through either the top cover 500 or the substrate 100. The microcavity stack 400 functions to restrict light emissions in directions parallel to the substrate 100 and also provides increased light emissions toward the viewer in a direction perpendicular to the substrate. The top cover 500 is typically transparent and provides sealing and protection for the entire OLED.

The microcavity stack 400 restricts light emissions in directions parallel to the planar substrate 100 and provides increased light emissions toward the viewer. The microcavity stack 400 minimizes the channelling of light in the organic material 300. The microcavity stack 400 also directs upward, light which has been emitted in a near Lambertian manner. The microcavity stack 400 reduces the activation of neighboring pixels, and increases contrast and color purity. In the preferred embodiment of the present invention, the microcavity stack 400 is located over the organic material 300. However, it is within the scope of the invention to include microcavity stacks both above and below the organic material 300. While FIG. 1 shows microcavity stack 400 as a discrete layer, it is within the scope of the present invention that the light restricting functions of the stack may be blended into the other elements of the OLED, e.g., the conductor layers.

The microcavity stack 400 may comprise alternating layers of dielectric material deposited on top of one another. Each layer of dielectric material may be chosen for its index of refraction. The thicknesses of each layer of dielectric material may be calculated using formulas commonly available to those skilled in the area. The thickness of each layer depends upon the number and type of layers contained within the microcavity stack 400 and on the types of organic material contained within the light emitting organic material layer 300. The microcavity stack 400 and the organic material layer 300 combine to narrow the bandwidth of the emitted light. Light emissions may be optimized by the microcavity stack 400 so that the majority of the emitted light falls into the near ultra violet or blue light range of the spectrum. The narrower range of emitted light allows color converters to be more efficient due to their narrower pick-up range.

The dielectric material may be evaporated at shallow angles to the planar substrate 100 in order to minimize pinhole density in the layers. An evaporation angle of approximately 30 to 50 degrees is preferred. As an alternative to evaporation, sputter depositing may also be used to reduce pinhole densities. For better results, the deposition may be conducted while the OLED structure is rotating. Shallow angle evaporation and sputter deposition reduce the pinhole density of the microcavity stack 400 below values normally obtained using conventional 90 degree deposition methods. Layers of transparent conductor may also be interspersed within the microcavity stack 400. For example, a layer of ITO may be mixed between the layers of dielectric material.

Zirconium oxide, silicon carbide, silicon oxide, silicon dioxide and lithium flouride are suitable dielectric materials for the layers which comprise the microcavity stack 400. The preferred process of depositing the dielectric material is sputter or ion beam deposition because these processes result in increased densification and large differences of indices of refraction between the dielectric layers. Evaporation or low temperature CVD may also be utilized as alternative processes. The use of ion bombardment during deposition of the dielectric material has many advantages. For example, ion embodiment allows a single material may be used for the entire microcavity stack 400. The stack 400 may be comprise alternating layers of densified and undensified dielectric material (e.g. $SiO_2$). Alternatively, transparent conductive material (e.g. $In_2O_3$) may be densified by ion bombardment and interspersed between layers of undensified dielectric material (e.g. ZnO). Ion bombardment also permits thin layers to used within the microcavity stack 400, which may include alternating layers of densified $ZrO_2$ and undensified $SiO_2$.

Figure 2:
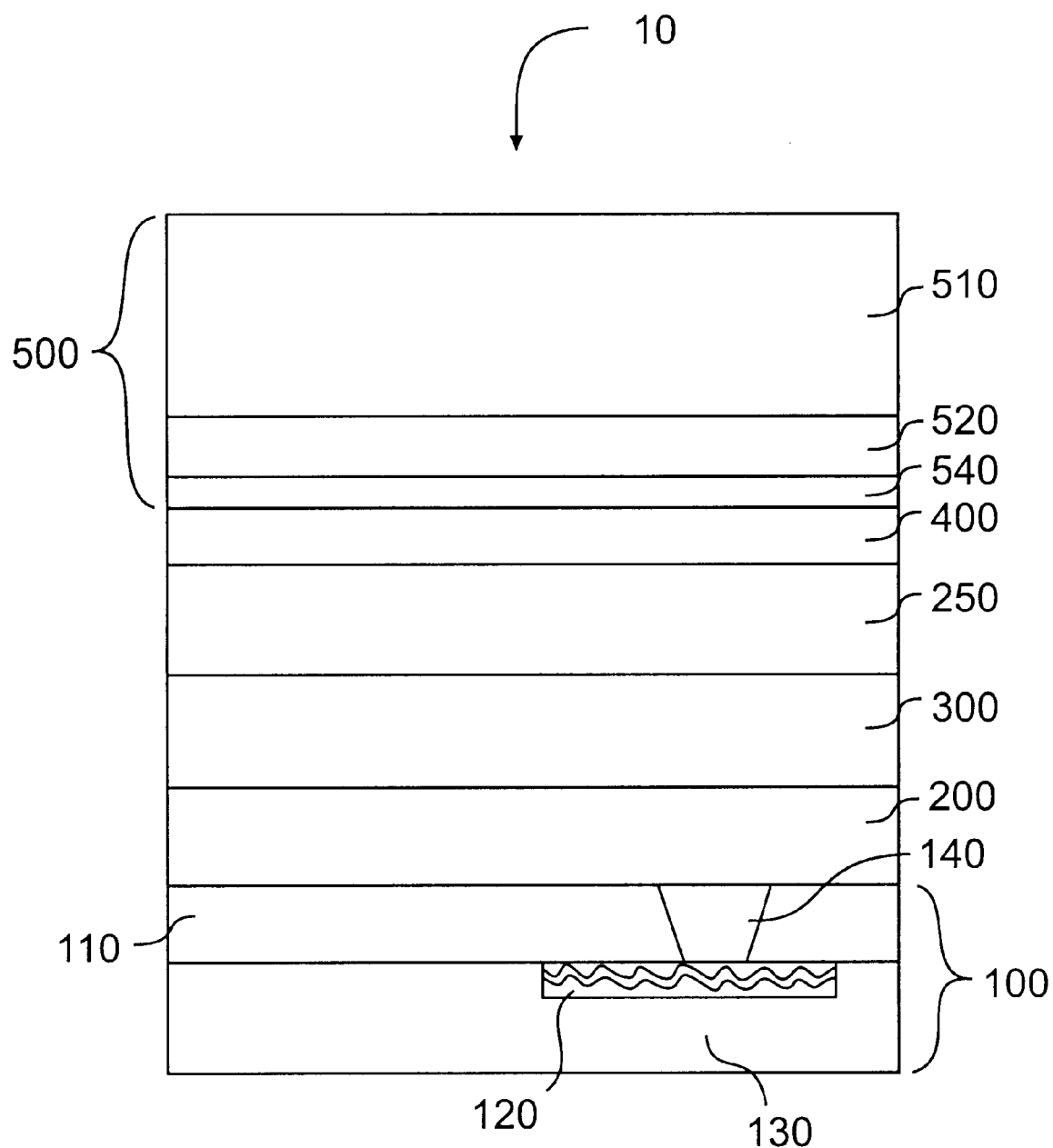
FIG. 2 is a side perspective view of an organic light emitting display device according to another embodiment of the present invention.

The substrate 100 may underlie a plurality of different subpixels or cells 10. The substrate 100 may be transparent if downward light emission is desired. The substrate 100 may be a planar thin film transistor array contained on glass (similar to those typically used for TFT-LCD notebook displays). The thin film transistor array may be placed on foil or ceramic. As an alternative to the thin film transistor array, the planar substrate 100 may be formed from a silicon integrated circuit wafer. As shown in FIG. 2, the silicon substrate layer 130 may comprise integrated circuits 120. The integrated circuit 120 may be connected to the first conductor 200 by way of a plug or via 140. The plug 140 is contained within an insulator 110 (e.g. $SiO_2$). The via or plug 140 may be filled with hot aluminum or tungsten which is chemical vapor deposited ("CVD") and may be planarized with the surrounding insulator using chemical-mechanical polishing ("CMP").

Figure 8:
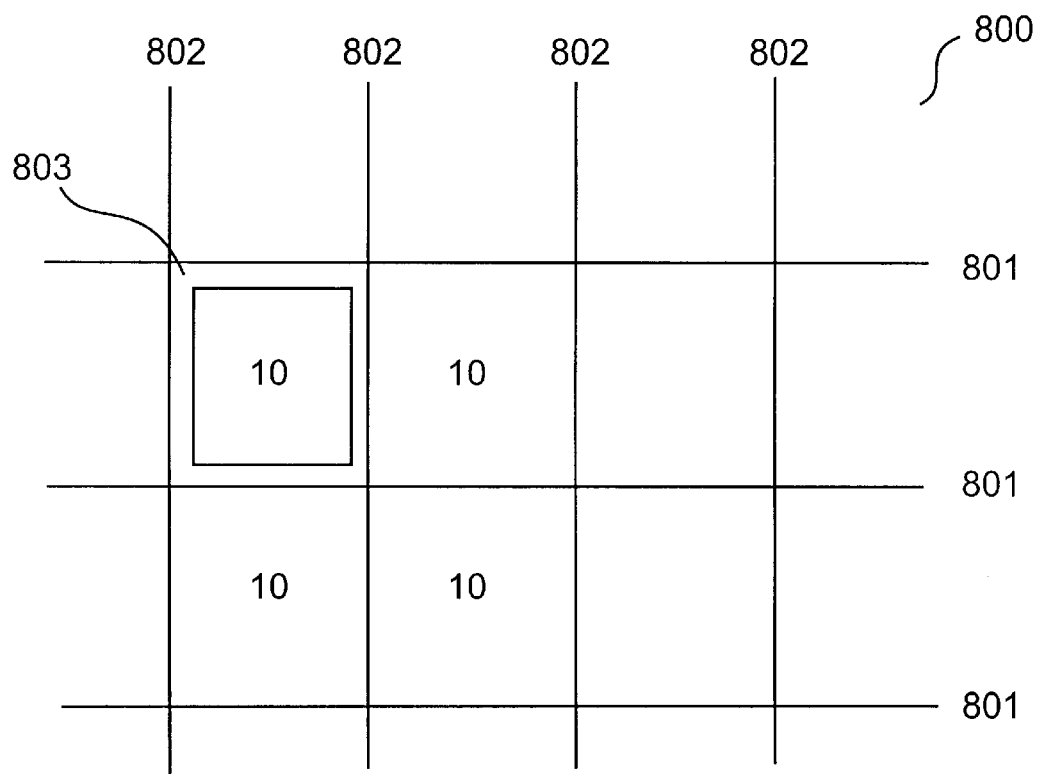
FIG. 8 is a simplified schematic representation of a matrix layout according to the present invention.

The planar substrate 100 may include the matrix 800, shown in FIG. 8. The matrix 800 includes matrix lines 801 or 802 which are capable of carrying current or voltage pulses of selected magnitudes. The pulses are provided to the matrix lines 801, 802 by drivers (not shown). The signals from the drivers pass to the conductors 200, 205 through one the matrix lines 801 and 802, the integrated circuit 120 and the plug 140. The signal from the driver current of varying magnitude to the conductors thereby determining whether or not each OLED or pixel cell, is on, off or at some intermediate gray level.

The matrix address lines 801, 802 may be sequenced so that light emissions are constantly changing. The viewer's eye integrates the emitted light to see images. The drivers are optimally built into the substrate 100 in order to save space and to minimize the number of connections. However, the drivers may be connected to the perimeter of the substrate 100 using TAB automated bonding or other well known techniques. The drivers may provide merely on/off signals for some applications such as word processing or spreadsheet. However, most software relies heavily upon different gray levels for providing additional information to the viewer, and therefore the drivers must provide pulses of various magnitudes.

The drivers generate coded pulses for the active matrix 800. The pulses may be coded using either amplitude or pulse width modulation. For the electroluminescent display of the present invention pulse width modulation is preferred because the sharpness of the transfer function limits the use of other methods. The pulse width modulated signal operates on a time slice basis, where the gray level is proportional to the amount of time the signal is applied to the subpixels or cells. Pulse width modulation is largely insensitive to the nonuniformities between different cells or OLEDs on the matrix. This insensitivity is a result of the signal switching between the two extreme points on the response curve. As a result, the use of a pulse width modulated driver signal reduces uniformity requirements and increases yield.

Ideally, the cells should be active almost continuously and refresh with a new signal every cycle (e.g., each cell is typically refreshed 10–75 times a second). A short negative current pulse is applied to a matrix line in order to refresh the cells connected to that line. This refreshing process permits the brightest light to be produced for any given voltage that is applied to the conductors. It is preferred that each OLED 10 include within its circuitry 120 a pair of transistors and a capacitor in order to achieve this end, although there are many acceptable substrate circuit designs. Normally, the image is presented to the viewer at all times except for during the brief period when a cell is being refreshed. In addition to improving OLED brightness, the refreshing process improves the OLED image retention inmmunity.

Figure 3:
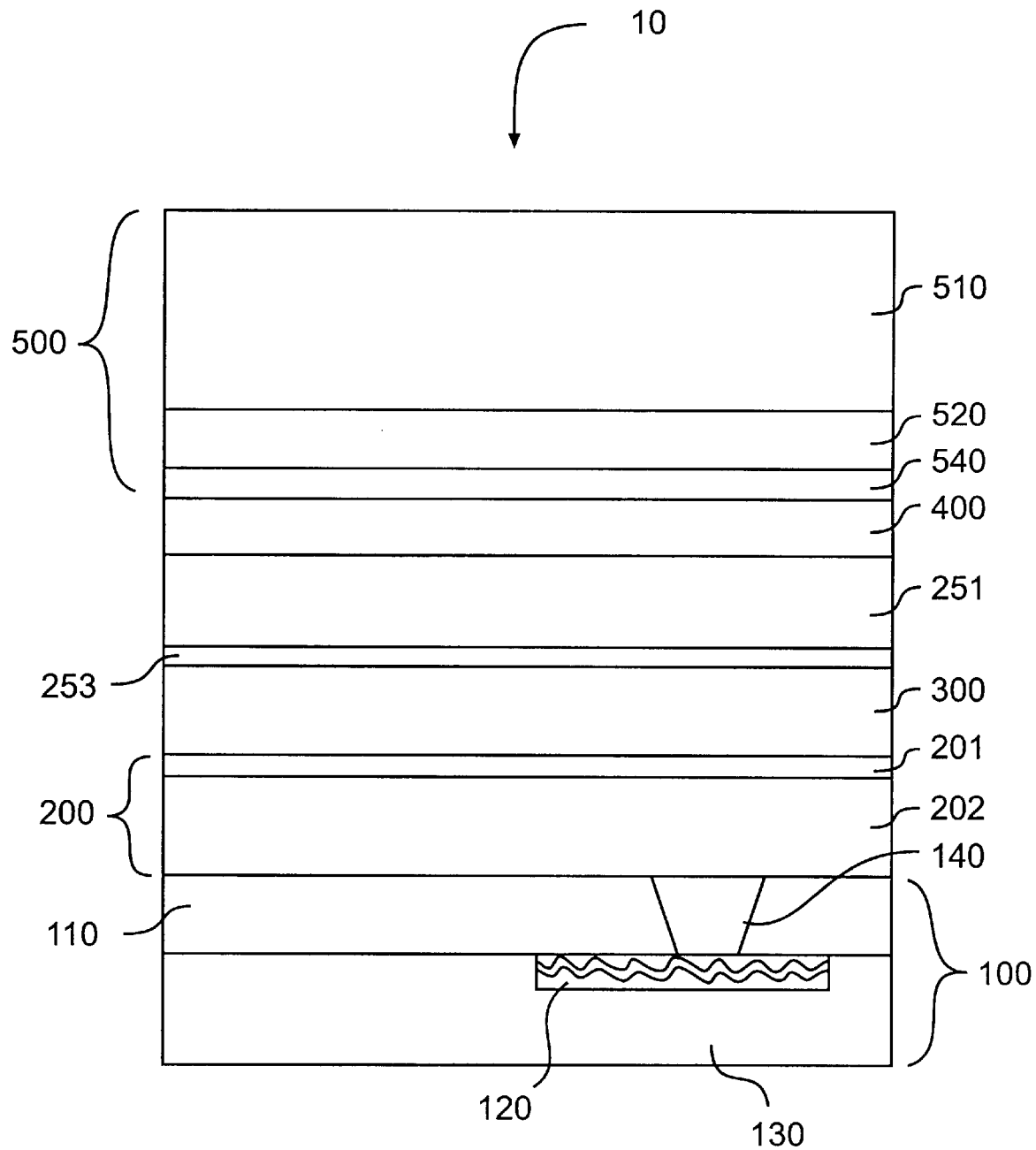
FIG. 3 is a side perspective view of an organic light emitting display device according to another embodiment present invention.

FIG. 3 discloses the first conductor 200 which may serve as either the cathode or anode. The first conductor 200 may be formed from materials such as $MoSI_2$, $WSI_2$, Mo, Al, or aluminum alloys such as Al–2% Cu or Al+5% Ti. The first conductor 200 includes a conductor pad 202 which may be planarized with a surrounding dielectric 201. Silicon dioxide is a preferred material for the dielectric 201. Prior to planarization the conductor pad 202 is formed thicker than required. A 500 mn amount of conductor is deposited followed by the deposition of 1,000 nm of silicon dioxide. The combined surface is chemically mechanically polished in order to leave a planar surface of mixed conductor and dielectric. The use of planarized conductor pads avoids edge steps which can result in thinning of the organic materials, and breakdown failures or broken conductors during fabrication.

Figure 4:
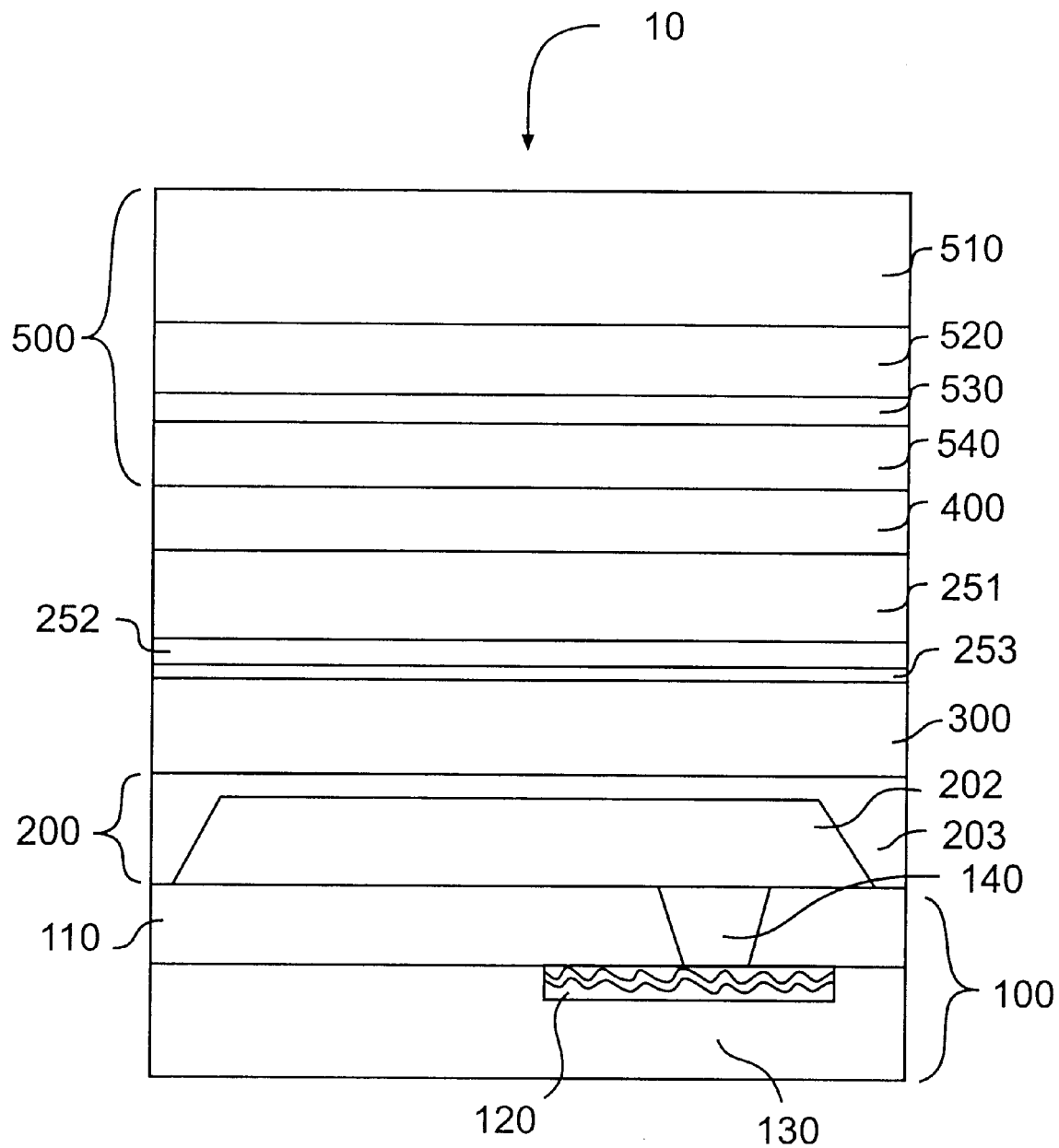
FIG. 4 is a side perspective view of an organic light emitting display device according to another embodiment of the present invention.
Figure 5:
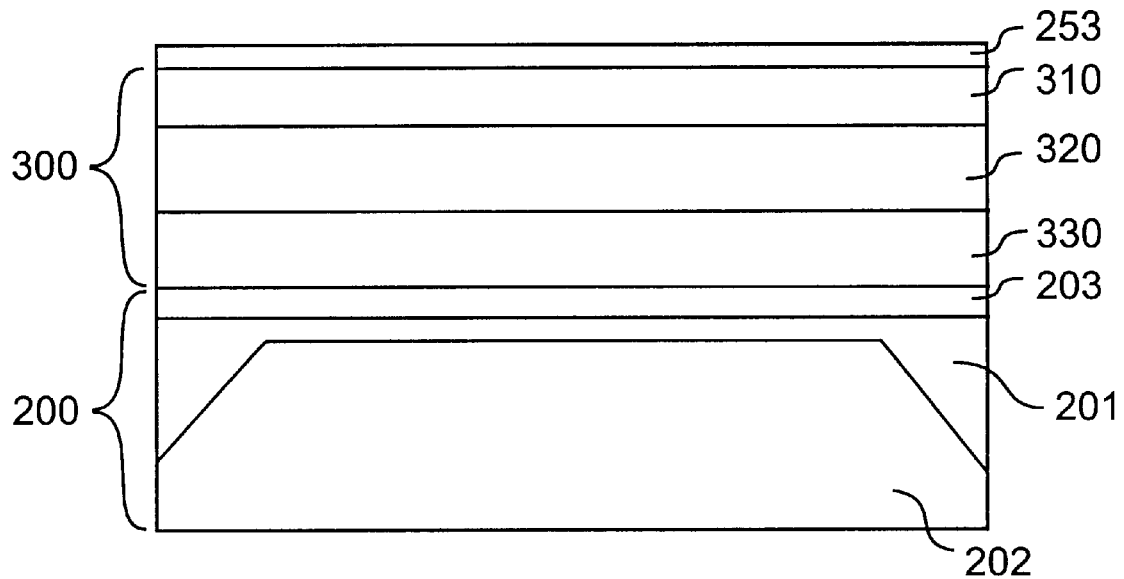
FIG. 5 is a partial cross sectional view of certain layers of an organic light emitting display according to an embodiment of the present invention.
Figure 6:
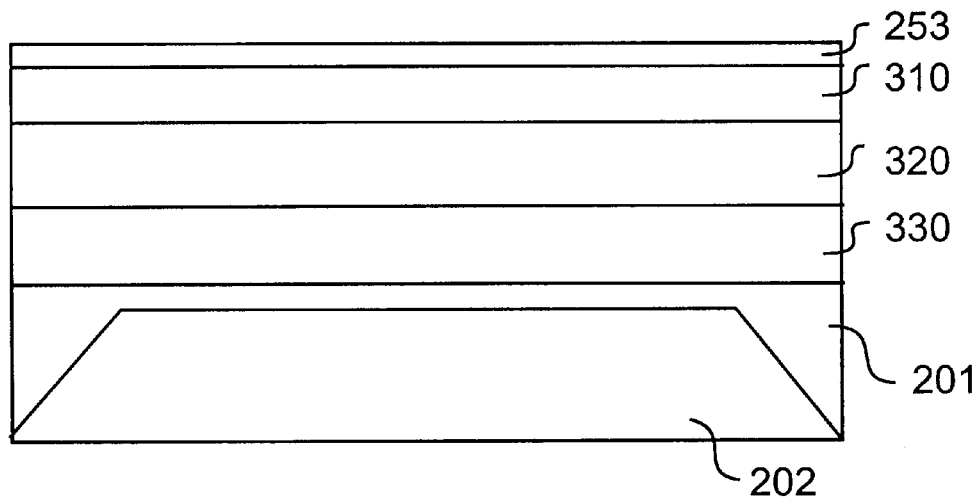
FIG. 6 is a partial cross sectional view of certain layers of an organic light emitting display according to an embodiment of the present invention.

As shown in FIG. 4, the first conductor 200 comprises a conductor pad 202 with tapered side walls of at least 30 degrees or even more. The sloped conductor pad 202 is surrounded by a transition layer 203 capable of injecting holes or electrons. The transition layer 203 may comprise barium titanate or other high dielectric constant materials. The transition layer 203 may also comprise a dielectric material comprising 5 to 60 percent Cr and SiO with or without low work function contaminants comprising alkali or alkaline metals such as Cs, Mg, Ba, Sc or Li or alloys or mixtures of these materials. The transition layer may also comprise other organic or inorganic injector materials such as CuPC. The slope of the pad 202 is achieved by undercutting the edges. The undercutting is achieved through resist or bilayer adhesion loss. Alternatively, the undercutting may be achieved by resist edge ablation during RIE. As shown in FIG. 5, the first conductor 200 may include both the transition layer 203 and dielectric layer 201. As injection enhancement layer (not shown) comprising Al+Li, Mg+Ag, or Pd, Pt or Au may be included over the transition barrier 203. The injection enhancement layer improves the injection of holes or electrons into the organic material 300.

FIG. 5 discloses the layer of light emitting organic material 300 which comprises three layers 310, 320 and 330. The arrangement of the layers is determined by the direction of electron injection into organic layer stack 300. When electrons are injected from the bottom of the stack 300, layer 330 is preferentially Perylene doped BAlq; layer 320 is preferentially NPB; and layer 310 is CuPc. In the case of top electron injection, the composition of layers 310 and 330 would switch. The preferred thicknesses for the CuPc, NPB and Perylene doped BAlq layers are 15 nm, 60 nm, and 70 nm, respectively. The Perylene doped BAlq layer produces blue light. Blue to ultraviolet light is preferred to obtain full color displays using color conversion. White emitters can be obtained from either dysprosium dopant or a mixed layer emitter. Other colors, such as green or white on black, may also be used for monochrome or multicolored displays. As an alternative, the layer of light emitting organic material 300 may be comprise a single blended layer rather than separate distinct layers.

Overlying the light emitting organic material 300 is the second conductor 250. As shown in FIG. 3, the second conductor 250 includes a conductor layer 251 and a transition layer 253. The transition layer 253 is preferentially formed from either LiF or barium and has a thickness of approximately 10 nms. In order to simplify fabrication, transition layers 253 and 203 are generally composed of identical materials. The conductor layer 251 is formed by depositing ITO to a thickness of approximately 150 nms using long throw distance S-gun sputtering. The S-gun sputter deposition process will close off pinholes in the conductor layer. Shadow masks commonly used in the electronics industry may also be used to keep the transparent conductors from depositing on and shorting out exposed leads near the perimeter of the display.

An optional getter layer 252 may be located between the conductor layer 251 and the transition layer 253. The getter layer 252 preferentially comprises alternating layers of zinc oxide and aluminum of approximately 1 nm each. The layers which make up the getter layer 252 are preferentially evaporated at shallow angles (e.g. 30 degrees). Pinholes in the getter layer 252 may be reduced by the shallow angle evaporation.

Overlying the second conductor 250 is the top cover 500. Top cover 500 includes a protective cover glass 510, a color converter layer 520, and a barrier layer 540. The transparent cover glass 510 preferentially is formed from silicon and has a thickness of approximately 0.2 mm thick. The cover glass 510 may overly the entire matrix 800.

As shown in FIG. 2, a barrier layer 540 overlies the microcavity stack 400. The barrier layer 540 comprises a layer of diamond-like amorphous carbon ("DLC") or silicon carbide (SiC), or in the case of top injecting OLEDs a cesium doped diamond-like carbide composition (CsC approximately 10% Cs and 90% C by molar ratio). DLC is a film consisting of amorphous carbon, which may include hydrogen, that is transparent and has a high refractive index (>2). Such films are typically deposited by laser ablation from graphite or plasma enhanced CVD from a gas such as methane with a small amount of oxygen. The barrier layer 540 acts a barrier to residual moisture within the OLED. The barrier layer 540 may also serve as a heat sink for heat generated during light emission. The barrier layer may also serve as a hole or electron injector. When functioning as an injector the barrier layer 540 is typically doped with Lithium or Palladium for electron or hole injection respectively.

As shown in FIG. 4, the barrier layer 540 underlies a sealing layer 530 and overlies the *microcavity stack 400. The barrier layer 540 may be formed using either shallow evaporation or Plasma Enhanced Chemical Vapor Deposition ("PECVD"). The PECVD process may include, for example, inductively coupled plasma using a methane and diluted $CF_4$ source plus an argon source. Transparent inductively coupled plasma DLC films have low pinhole density and a high index of refraction making them easy to use when mutually combined with PECVD evaporated or sputter deposited silicon dioxide layers. Silicon carbide formed from PECVD or evaporation may be used in lieu of the DLC high index of refraction layers.

Figure 7:
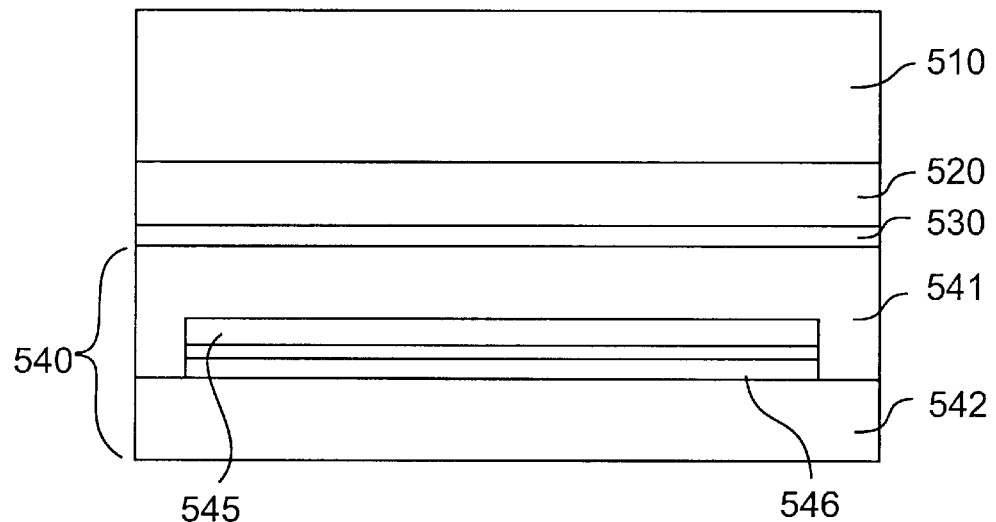
FIG. 7 is a partial cross sectional view of certain layers of an organic light emitting display according to an embodiment of the present invention.

As shown in FIG. 7, the barrier layer 540 may comprise an upper DLC layer 541 and a lower DLC layer 542. Multiple layers of getter material 545 and 546 may be formed within the top layer 541. The getter material layers may be formed from calcium, magnesium, titanium or aluminum in alternation with DLC or other dielectric materials $S_3N_4$, SiO or $SiO_2$. A transparent conductor such as ZnO may be used in place of the transparent dielectric material in order to provide added conductivity. While, the structure and materials set forth above are preferred, the invention includes the use of getter layer comprising any transparent material capable of removing moisture.

A sealing layer 530 may be included between the barrier layer 540 and the color converter layer 520. The sealing layer 530 hermetically seals the OLED in order to protect the device from oxygen and moisture. The sealing layer 530 is typically formed from a commercially available heat sink gel material. The gel material may be dried extensively by heating in a high vacuum or by mixing in a desiccant such as BaO. As an alternative, an ultraviolet light cured epoxy, e.g. Acrylate, may be used. Solvent containing adhesives are not recommended unless a totally pinhole free cover layer is produced. The sealing layer 530 may further comprise a mixture of chemically active materials such as fmely powdered aluminum, calcium, magnesium or titanium for moisture removal. Hermetic metal seals may also serve as the sealing layer 530. These metal seals are commonly used for hermetically packaging electronic equipment.

The sealing layer 530 may cover a plurality of OLEDs contained within a display. The sealing layer 530 is applied uniformly across the display to ensure no oxygen or moisture is trapped within the display. The sealing layer 530 is preferentially formed in a vacuum environment. If a vacuum environment is not available, the sealing layer 530 may be formed in an inert gas environment such as nitrogen or argon. Adhesion in the sealing layer 530 may be induced by selection of the proper sealing conditions. For example, exposing a display, fabricated according to the present invention, to a temperature of 100° C. and a pressure of 50 psi will normally induce adhesion between the sealing gel and the surrounding layers. If the OLED is sealed in a vacuum, the resulting gap may be eliminated when air pressure is returned to the exterior of the OLED.

The sealing layer 530 may include a heat adhesive perimeter seal (not shown). The perimeter seal may be used alone or in conjunction with the sealing layer 530 which extends across the entire display. Getter material such as finely divided Mg, Ba, Ca, Al or Ti may be mixed into the perimeter seal for additional vapor collection. The perimeter seal typically comprises an ultraviolet light cured epoxy.

The color converter layer 520 may be formed by providing color conversion dye materials above the barrier layer 540. The color conversion dye materials work with an OLED emitter that emits short wave length lights, for example blue, near ultraviolet, or ultraviolet. The dye materials generally comprise PPV based compounds or other fluorescent materials and are commercially available from many sources including, for example, Idemitsu Kosan Corporation. The dye materials absorb the short wave length flight and re-emit or fluoresce longer wave length flight in characteristic colors such as red or green. These color conversion dye materials may be selected and patterned on the cover glass 510 using conventional lithographic means. The dye materials may be used to create a full color CRT-like display with red, green and blue pixels. The varying grey levels available from the perimeter drivers and the active matrix may be used to create intensity mixtures of three primary colors and result in TV-like images. Blue converter dye material may be used if near-ultraviolet light emitting layers are used.

Full color displays may be displayed using color filters in lieu of converter dye material. The color filter may be used with a white light emitting organic layer 300. Blue light emitting organic material may be used with or without color filters. A further embodiment of the color converter layer 520, utilizes commercially available color wheels or pi-cells for color conversion. All of these techniques are commonly known in the industry.

The present invention also includes the use of black matrix or reflective metal trenches 803 surrounding each subpixel or OLED 10. The black matrix or reflective metal trenches 803, shown in FIG. 8, help to minimize channeling in the small pitch pixels and improve color purity. The black matrix preferably comprises a mixture of co-evaporated 40 to 80% chromium and silicon oxide. If the OLED is to be used in a head wearable application, e.g. medical imaging, night vision, or virtual reality applications, it is preferred to use chromium or aluminum reflective barriers. The chromium or aluminum barriers may provide more light output while at the same time controlling channeling.

It will be apparent to those skilled in the art that various modifications and variations can be made in the construction, configuration, and/or operation of the present invention without departing from the scope or spirit of the invention. For example, in the embodiments mentioned above, various changes may be made to the composition of the organic material layers without departing from the scope and spirit of the invention. Further, it may be appropriate to make additional modifications or changes to microcavity structure without departing from the scope of the invention. Thus, it is intended that the present invention cover the modifications and variations of the invention provided they come within the scope of the appended claims and their equivalents.

I claim:

1. An organic light emitting device comprising:
   a substrate;
   a first conductor overlying said planar substrate;
   a layer of light emitting organic material overlying said first conductor;
   a second conductor overlying said layer of light emitting material; and
   a means for restricting light emission in directions parallel to said substrate.

2. The device according to claim 1, wherein said substrate comprises a silicon wafer.

3. The device according to claim 2, further comprising a means for connecting said silicon wafer to said first conductor.

4. The device according to claim 1, wherein said first conductor is planarized.

5. The device according to claim 1, wherein said means for restricting light emission comprises a layer of dielectric material.

6. The device according to claim 1, wherein said means for restricting light emission comprises a plurality of layers of dielectric material.

7. The device according to claim 6, wherein each of said plurality of layers of dielectric material has a different index of refraction from that of any adjacent layer.

8. The device according to claim 6, wherein at least one of said plurality of layers of dielectric is deposited at an angle to said substrate.

9. The device according to claim 6, wherein at least one of said plurality of of layers of dielectric material is evaporated at an angle to said substrate.

10. The device according to claim 6, wherein said substrate is rotating when at least one of said plurality of layers of dielectric material is constructed.

11. The device according to claim 1, wherein said means for restricting light emission comprises a layer of transparent conductor material.

12. The device according to claim 1, wherein said means for restricting light emission comprises a plurality of layers of transparent conductor material overlying said first conductor and underlying said light emitting organic material.

13. The device according to claim 1, wherein said means for restricting light emission overlies said layer of light emitting organic material.

14. The device according to claim 1, further comprising a transition layer underlying said first conductor.

15. The device according to claim 1, further comprising a barrier layer overlying said second conductor.

16. The device according to claim 15, wherein said barrier layer comprises diamond-like carbon material.

17. The device according to claim 15, wherein said barrier layer is an electron injector.

18. The device according to claim 15, further comprising a getter layer overlying said second conductor and underlying said barrier layer.

19. The device according to claim 15, further comprising a sealing layer overlying said barrier layer.

20. The device according to claim 19, wherein said sealing layer comprises a heat adhesive seal.

21. The device according to claim 15, further comprising a top cover overlying said barrier layer.

22. The device according to claim 1, further comprising a getter layer overlying said layer of light emitting organic material and underlying said second conductor.

23. The device according to claim 1, wherein said substrate is planar.

24. An organic light emitting device comprising:
   a planar substrate, comprising a silicon wafer and a conducting plug, wherein said silicon wafer further comprises integrated circuitry, and said conducting plug connects the integrated circuitry to a conductor pad, wherein said conductor pad overlies said planar substrate;
   a layer of light emitting organic material overlying said conductive pad;
   a layer of getter material capable of reacting with water overlying said layer of light emitting organic material;
   a transparent conductor layer overlying said getter layer;
   a plurality of layers of dielectric material, wherein each of said plurality of layers of dielectric material has a different index of refraction from any adjacent layer;
   a barrier layer overlying said layers of dielectric material; wherein said barrier layer is formed from diamond-like carbon; and
   a transparent top cover overlying said barrier layer.

* * * * *